United States Patent
Furuya

(10) Patent No.: US 7,883,935 B2
(45) Date of Patent: Feb. 8, 2011

(54) METHOD OF MANUFACTURING A SEMICONDUCTOR DEVICE

(75) Inventor: Akira Furuya, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/758,432

(22) Filed: Apr. 12, 2010

(65) Prior Publication Data

US 2010/0210102 A1 Aug. 19, 2010

Related U.S. Application Data

(62) Division of application No. 11/962,154, filed on Dec. 21, 2007, now Pat. No. 7,728,434.

(30) Foreign Application Priority Data

Dec. 21, 2006 (JP) ............................. 2006-345073

(51) Int. Cl.
*H01L 21/00* (2006.01)
*H01L 21/16* (2006.01)
*H01L 21/4763* (2006.01)

(52) U.S. Cl. ............... 438/104; 438/622; 257/E21.495; 257/E23.141

(58) Field of Classification Search .......... 257/E21.485, 257/E23.141; 438/104, 622
See application file for complete search history.

(56) References Cited

U.S. PATENT DOCUMENTS

2008/0174018 A1 7/2008 Ueda

2009/0206485 A1 8/2009 Yang et al.

FOREIGN PATENT DOCUMENTS

| JP | 2000-269455 | 9/2000 |
|---|---|---|
| JP | 2002-075994 | 3/2002 |
| JP | 2005-236285 | 9/2005 |
| JP | 2005-347510 | 12/2005 |
| JP | 2006-005305 | 1/2006 |
| JP | 2006-019325 | 1/2006 |

OTHER PUBLICATIONS

Chinese Patent Office issued a Chinese Office Action on Nov. 21, 2008, Application No. 200710160072.2.
Ohashi et al., "Robust Porour MSQ (k=2.3, E=12 GPa) for Low-temperature (<350° C.) Cu/Low-k Integration using ArF Resist Mask Process", 2003, pp. 857-860.
Matsunaga et al., "BEOL Process Integration Technology for 45nm Node Porous Low-k/Copper Interconnects", 3 pages, 2005.

*Primary Examiner*—David S Blum
(74) *Attorney, Agent, or Firm*—Young & Thompson

(57) ABSTRACT

Aimed at improving adhesiveness between upper and lower interconnects in semiconductor devices, a semiconductor device of the present invention includes a second dielectric multi-layered film formed on a substrate, and containing a lower interconnect; a first dielectric multi-layered film formed on the second dielectric multi-layered film, and having a recess; an MOx film formed on the inner wall of the recess, and containing a metal M and oxygen as major components; an M film formed on the MOx film, and containing the M as a major component; and an electric conductor formed on the M film so as to fill the recess, and containing Cu as a major component, wherein the surficial portion of the interconnect fallen straight under the bottom of the recess has an oxygen concentration of 1% or smaller.

11 Claims, 7 Drawing Sheets

FIG. 6A
FIG. 6B
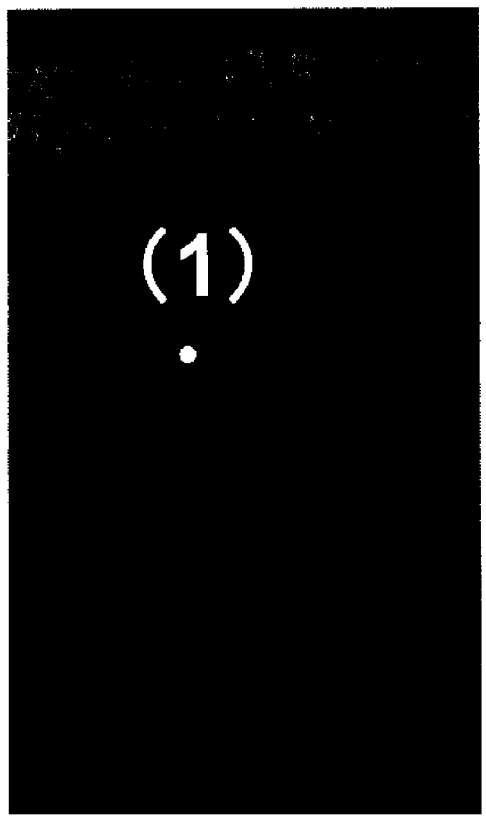
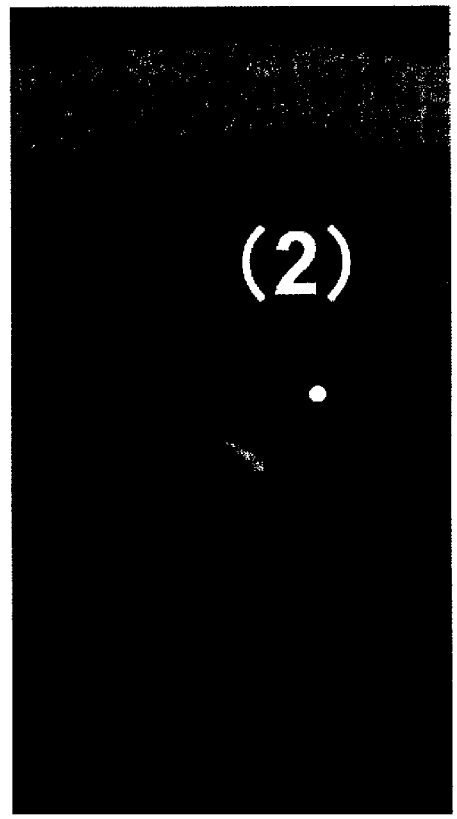

METHOD OF MANUFACTURING A SEMICONDUCTOR DEVICE

This application is based on Japanese patent application No. 2006-345073 the content of which is incorporated hereinto by reference and claims priority as a divisional to U.S. patent application Ser. No. 11/962,154, filed Dec. 21, 2007, now U.S. Pat. No. 7,728,434.

BACKGROUND

1. Technical Field

The present invention relates to a semiconductor device and a method of manufacturing the same.

2. Related Art

In recent semiconductor devices, delay in signal transmission on interconnects may sometimes determine operation speed of LSI circuits. Delay constant of signal transmission on interconnects is expressed by a product of interconnect resistance and parasitic capacitance. In order to reduce the parasitic capacitance, a low-dielectric-constant material (low-k material) having a dielectric constant smaller than that of the conventionally-used silicon dioxide ($SiO_2$) has been used as a material for composing insulating interlayer. On the other hand, in view of reducing resistivity of the interconnects so as to raise operation speed of the LSI circuits, copper (Cu) having a small resistivity has been used as an electro-conductive material.

Cu multi-layered interconnect may be formed by the damascene process. The damascene process includes a step of depositing an insulating film such as an insulating interlayer, a step of forming recesses (interconnect trenches for forming interconnects, or via holes for forming via plugs), a step of depositing barrier metal layer, a step of depositing a Cu thin film called Cu seed, a step of filling the recesses by depositing Cu using the Cu thin film as a cathode of electrolytic plating, a step of removing a portion of the barrier metal layer formed outside the recesses by chemical mechanical polishing, and a step of depositing a barrier insulating film.

As for the insulating interlayer, porous low-dielectric-constant materials have been discussed aiming at reducing the dielectric constant to as small as 2 or around.

N. Ohashi, K. Misawa, S. Sone, H. J. Shin, K. Inukai, E. Soda, S. Kondo, A. Furuya, H. Okamura, S. Ogawa and N. Kobayashi, "Robust Porous MSQ (k=2.3, E=12 GPa) for Low-Temperature (<350° C.) Cu/Low-k Integration Using ArF Resist Mask Process", Proceedings of IEEE International Electron Devices Meeting 2003, pp. 35.5.1-35.5.4. points out problems in the porous low-dielectric-constant materials, such as lowering in the material strength, elevation of dielectric constant caused by moistening, and corrosion of the porous dielectric materials called low-k void, and discloses a technique of solving these problems by optimizing composition of the low-dielectric-constant material, and etching method in the damascene process.

N. Matsunaga, N. Nakamura, K. Higashi, H. Yamaguchi, T. Watanabe, K. Akiyama, S. Nakao, K. Fujita, H. Miyajima, S. Omoto, A. Sakata, T. Katata, Y. Kagawa, H. Kawashima, Y. Enomoto, T. Hasegawa and H. Shibata, "BEOL Process Integration Technology for 45 nm Node Porous Low-k/Copper Interconnects", Proceedings of the IEEE International Interconnect Technology Conference 2005, pp. 6-8 discloses a technique of providing a dummy pattern, aiming at preventing oxidation of the barrier metal layer due to gas released by the porous insulating interlayer.

Japanese Laid-Open Patent Publication No. 2005-236285 discloses a technique of depositing a high-density dielectric material between the porous low-dielectric-constant material and the barrier metal layer, in order to prevent the barrier metal layer from being thinned due to irregularities conforming to voids of the porous low-dielectric-constant material, and from being degraded in reliability.

On the other hand, as for the electro-conductive material, thinning of the Cu seed has been discussed, aiming at improving Cu filling. Because holes in Cu interconnects (called voids, referred to as "voids" hereinafter) are known to degrade electrical characteristics (resistance, reliability, yield ratio, etc.), void-less filling is of importance in Cu plating.

Rate of formation of film in the Cu plating is faster at around the frontage and the bottom of the recess. Therefore, the void-less filling may successfully be achieved if Cu plating grown from the bottom of the recess reaches the frontage of the recess, before the frontage of the recess is clogged by the Cu plating. It may therefore be understood that wider frontage can facilitate the void-less filling.

On the other hand, the Cu seed has been becoming more thinner with recent progress of shrinkage of devices, so that it has been discussed to directly plate Cu on the barrier metal using the barrier metal per se as a seed, rather than depositing the Cu seed.

In particular, ruthenium (Ru) showing a good adhesiveness with Cu has been attracting much public attention as a barrier metal. Because Ru retains the electro-conductivity even after being oxidized, it has been attracting much attention also from the viewpoint of widening process margin with respect to the filling by plating. Japanese Laid-Open Patent Publication No. 2002-75994 discloses a technique of using a barrier metal composed of a metal (Ru, etc.) showing electro-conductivity even after being oxidized, or an oxide thereof. Use of Ru as the barrier metal, however, suffers from a problem in adhesiveness, because the metal state of which shows only a poor adhesiveness to the insulating interlayer, and an oxide state of which shows only a poor adhesiveness to Cu. Efforts of improvements have been made typically as seen in Japanese Laid-Open Patent Publication Nos. 2000-269455, 2005-347510, 2006-5305, and 2006-19325.

Japanese Laid-Open Patent Publication No. 2000-269455 discloses a technique of using a barrier metal composed of a metal showing electro-conductivity even after being oxidized (Ru, etc.) or its oxide, added with Pd or the like.

Japanese Laid-Open Patent Publication No. 2005-347510 discloses a technique of using a barrier metal composed of a C, N or Si compound of a metal showing electro-conductivity even after being oxidized (Ru, etc.), a transition layer, and a metal showing electro-conductivity even after being oxidized, stacked in this order as viewed from the insulating film side.

Japanese Laid-Open Patent Publication No. 2006-5305 discloses a technique of using a barrier metal composed of an oxide of a metal showing electro-conductivity even after being oxidized (Ru, etc.), a transition layer, and a metal, stacked in this order as viewed from the insulating film.

Japanese Laid-Open Patent Publication No. 2006-19325 discloses a technique of raising elastic modulus of the transition layer, in order to improve a poor mechanical strength in the configuration shown in Japanese Laid-Open Patent Publication No. 2006-5305.

However, the present inventor found out, from his investigation, a problem in that use of the metal oxide film, as described in Japanese Laid-Open Patent Publication Nos. 2000-269455, 2005-347510, 2006-5305, and 2006-19325 may degrade the adhesiveness between the upper interconnect and the lower interconnect, and may consequently degrade electrical characteristics and reliability. This is because Cu contained in the lower interconnect is oxidized due to an oxidative atmosphere used for forming the metal oxide film.

A possible method of preventing oxidation of Cu contained in the lower interconnect in the process of forming the metal oxide film may be such as depositing a high-density dielectric film on the insulating interlayer, and then depositing the barrier metal, based on combination of the inventions described in Japanese Laid-Open Patent Publication Nos. 2005-236285, 2000-269455, 2005-347510, 2006-5305, and 2006-19325. Oxidation of Cu contained in the lower interconnect is, however, inevitable because the thickness of the high-density dielectric film at the bottom of the recess will be as small as several nanometers in the generation of a technical node of 45 nm or thereafter. Oxidation of Cu contained in the lower interconnect may raise problems of increase in resistivity of the interconnects, and degradation of the reliability.

Although the description in the above has been made assuming the cases where a via-forming layer is formed on an interconnect layer by the single damascene process, or where a via-and-interconnect-forming layer is formed by the dual damascene process, the same problem resides also for the case where an interconnect layer is formed on the via plug.

SUMMARY

According to the present invention, there is provided a semiconductor device which includes: a second dielectric multi-layered film formed on a substrate, and containing an interconnect; a first dielectric multi-layered film formed on the second dielectric multi-layered film, and having a recess; an MOx film formed on the inner wall of the recess, and containing a metal M and oxygen as major components; an M film formed on the MOx film in the recess, and containing the M as a major component; and an electric conductor formed on the M film in the recess so as to fill the recess, and containing Cu as a major component, wherein the surficial portion of the interconnect fallen straight under the bottom of the recess has an oxygen concentration of 1% or smaller.

Because there is substantially no oxygen residing at the interface between the upper and lower interconnects, a semiconductor device excellent in adhesiveness between the upper and lower interconnects may be provided.

According to the present invention, there is provided also a method of manufacturing a semiconductor device, which includes: forming a second dielectric multi-layered film containing an interconnect on a substrate, and forming a first dielectric multi-layered film on the second dielectric multi-layered film; forming a recess in the first dielectric multi-layered film so as to extend therethrough; forming an MOx film containing a metal M and oxygen as major components on the first dielectric multi-layered film and inside the recess, by a reactive film-forming process in an oxidative atmosphere; removing a portion of the MOx film formed at the bottom of the recess; forming an M film containing the M as a major component on the MOx film extended over the inside and the outside of the recess, and at the bottom of the recess; forming an electric conductor containing Cu as a major component on the M film extended over the inside and the outside of the recess, so as to fill the recess; and removing portions of the MOx film, the M film and the electric conductor laid outside of the recess.

By virtue of this configuration, oxidation of the lower interconnect may be suppressed, adhesiveness between the upper and lower interconnects may be improved, and thereby reliability of the semiconductor device may be improved.

In short, the present invention may provide a semiconductor device improved in the adhesiveness between the upper and lower interconnects, and a method of manufacturing thus-improved semiconductor device.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 6A and 6B are drawings showing sections observed when oxygen concentration was measured at the interface between the upper and lower interconnects.

DETAILED DESCRIPTION

Figure 1:
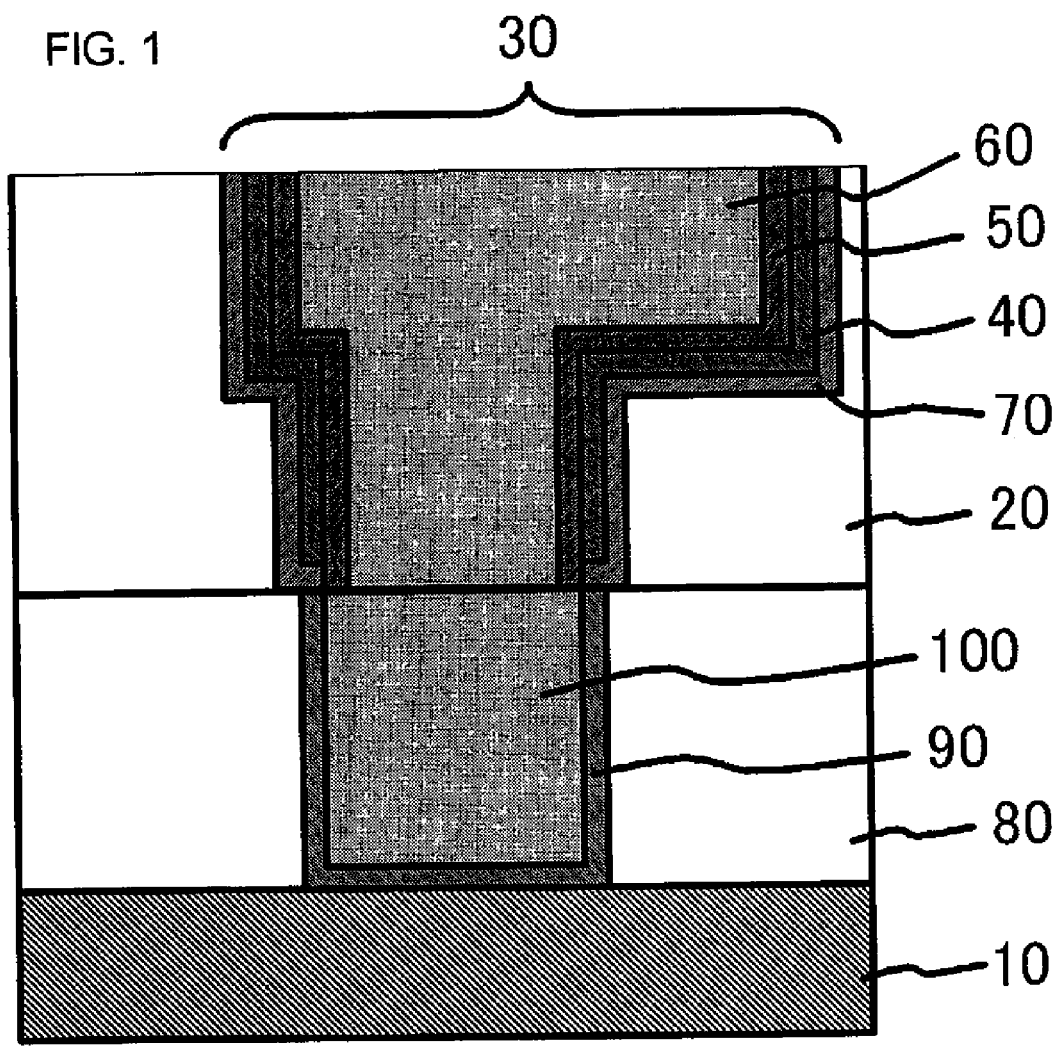
FIG. 1 is a sectional view showing a configuration of a semiconductor device according to a first embodiment.

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

Paragraphs below will describe embodiments of the present invention, referring to the attached drawings. In all drawings, any similar constituents will be given with similar reference numerals, and explanations therefor will not be repeated.

First Embodiment

FIG. 1 is a sectional view showing a part of an interconnect layer of a semiconductor device in this embodiment.

The semiconductor device has a second dielectric multi-layered film 80 formed on a substrate 10, and containing a lower interconnect 100; a first dielectric multi-layered film 20 formed on the second dielectric multi-layered film 80, and having a recess 30, an MOx film 40 formed on the inner wall of the recess 30, and containing a metal M and oxygen as major components; an M film 50 formed on the MOx film 40 in the recess, and containing the M as a major component, and an electric conductor 60 formed on the M film 50 in the recess 30 so as to fill the recess 30, and containing Cu as a major component. The semiconductor device further has a dielectric film 70 containing substantially no oxygen, formed between the first dielectric multi-layered film 20 and the MOx film 40.

The surficial portion of the interconnect 100 fallen straight under the bottom of the recess 30 has an oxygen concentration of 1% or smaller.

The substrate 10 has transistors, capacitor elements and so forth formed therein, and the second dielectric multi-layered film 80 has a barrier metal layer 90, a lower interconnect 100 and so forth formed therein. The lower interconnect 100 is composed of a material containing at least either of Cu or Al as a major component.

The first dielectric multi-layered film 20 is a porous dielectric multi-layered film, and may be formed using a $SiO_2$/p-MSQ/SiOC film. The p-MSQ herein means a porous methyl silsesquioxane. The first dielectric multi-layered film 20 is, however, not limited to the $SiO_2$/p-MSQ/SiOC film, and may be a multi-layered film of dielectric films containing at least Si or C.

The recess 30 is formed so as to extend through the first dielectric multi-layered film 20. At the bottom of the recess 30, the interconnect buried in the second dielectric multi-layered film 80 exposes.

The inner wall of the recess 30 herein means the inner portion of the recess excluding the bottom portion.

M is ruthenium (Ru). The MOx film 40 and the M film 50 form a RuO/Ru stacked structure. The stacked structure is primarily aimed at improving adhesiveness of the first dielectric multi-layered film 20, but also contributes to suppress oxidation-induced degradation of the lower interconnect 100 in this embodiment. By virtue of this configuration, the adhesiveness of the first dielectric multi-layered film 20 may be enhanced, and the reliability may be improved. Additional effect is that Ru shows electro-conductivity even after being oxidized, and may therefore suppress increase in the resistivity of interconnects.

The M is not limited to Ru, but may be any metals containing at least one material selected from iridium (Ir), tantalum (Ta), titanium (Ti), tungsten (W), and so forth. The MOx may include carbon (C), for example, derived from film-forming materials.

The dielectric film 70 containing substantially no oxygen is formed between the M film 50 and the first dielectric multi-layered film 20. This configuration may prevent moisture diffusion typically from the p-MSQ contained in the first dielectric multi-layered film 20, and may further reduce the risk of degradation of adhesiveness, caused by oxidation of the M film 50. Even if the moisture diffusion from p-MSQ should occur, the M film 50 and the first dielectric multi-layered film 20 may be prevented from being degrading in the adhesiveness, because the MOx film 40 is provided therebetween, and because the MOx film 40 does not cause the oxidation-induced expansion in volume.

The dielectric film 70 may be formed using a SiCN film or the like.

Electric conductor 60 containing Cu as a major component is formed so as to fill the recess 30, not limited to Cu—Al alloy, but may be any materials such as Cu, Cu—Ti alloy, Cu—Sn alloy and so forth which are generally used for semiconductor process.

Straight under the bottom of the recess 30, there is laid the lower interconnect 100 buried in the second dielectric multi-layered film 80 formed on the substrate, wherein the oxygen concentration of the surficial portion of the interconnect is adjusted to 1% or smaller. In other words, the oxygen concentration at the interface between the lower interconnect 100 exposed at the bottom of the recess 30 and the electric conductor 60 filled in the recess 30 is adjusted to 1% or smaller.

The oxygen concentration can be measured using an energy dispersive X-ray analyzer. Measurement limit is 1% or around. That is, an oxygen concentration of 1% or smaller means that the concentration is equivalent to or lower than the measurement limit, and that there is substantially no oxygen.

Figure 7A:
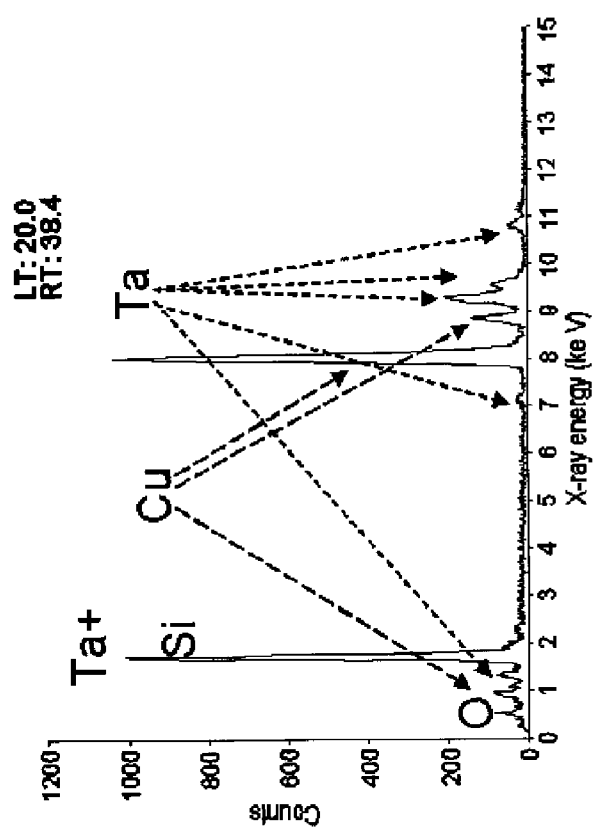
FIGS. 7A and 7B are drawings showing results of measurement of oxygen concentration at the interface between the upper and lower interconnects.
Figure 7B:
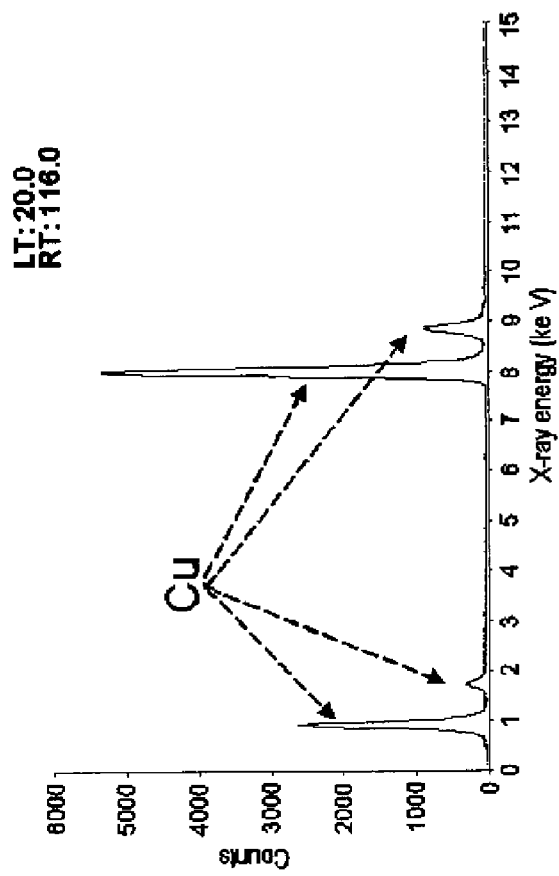

FIGS. 6A and 6B show sections observed when oxygen concentration was measured at the interface between the upper interconnect containing Cu as a major component and the lower interconnect. The oxygen concentration was measured at the positions (1) and (2) indicated by the open dots. FIGS. 7A and 7B show results of measurement of oxygen concentration at the interface between the upper interconnect containing Cu as a major component and the lower interconnect. No oxygen was detected when there is no separation between the upper and lower interconnects (FIG. 6A, FIG. 7A), but 4 to 5% of oxygen was detected when the separation occurred between the upper and lower interconnects (FIG. 6B, FIG. 7B).

It is therefore understood that the adhesiveness degrades as the oxygen concentration grows higher, and the adhesiveness improves as the oxygen concentration comes closer to 0%. In other words, an oxygen concentration of 1% or smaller in the surficial portion of the lower interconnect 100 fallen straight under the bottom of the recess 30 means that there is substantially no oxide layer at the interface between the upper and lower interconnects.

By virtue of this configuration, any degradation in the electrical characteristics and reliability of the semiconductor device as a whole, cause by oxidation of the lower interconnect 100, may be avoidable.

Next, a method of manufacturing the semiconductor device shown in FIG. 1 will be explained. FIGS. 4A to 4D are sectional views showing process steps of manufacturing the semiconductor device.

Procedures for manufacturing the semiconductor device typically include the process steps below:

step 1: forming the second dielectric multi-layered film 80 containing the lower interconnect 100 on the substrate, and forming the first dielectric multi-layered film 20 on the second dielectric multi-layered film 80;

step 2: forming the recess 30 in the first dielectric multi-layered film 20 so as to extend therethrough;

step 3: forming the dielectric film 70 containing substantially no oxygen on the first dielectric multi-layered film 20 and inside the recess 30; and step 4: forming the MOx film 40, containing a metal M and oxygen as major components, on the dielectric film 70 containing substantially no oxygen extended over the inside and the outside of the recess 30, by a reactive film-forming process in an oxidative atmosphere;

step 5: removing portions of the dielectric film 70 and the MOx film 40 formed at the bottom of the recess 30;

step 6: forming the M film 50 containing the M as a major component on the MOx film 40 extended over the inside and the outside of the recess 30, and at the bottom of the recess 30;

step 7: removing a portion of the M film 50 formed at the bottom of the recess 30;

step 8: forming the electric conductor 60 containing Cu as a major component on the M film 50 extended over the inside and the outside of the recess 30, so as to fill the recess 30; and step 9: removing portions of the MOx film 40, the M film 50, the dielectric film 70, and the electric conductor 60 laid outside of the recess 30.

Paragraphs below will detail the individual process steps.

Figure 4A:
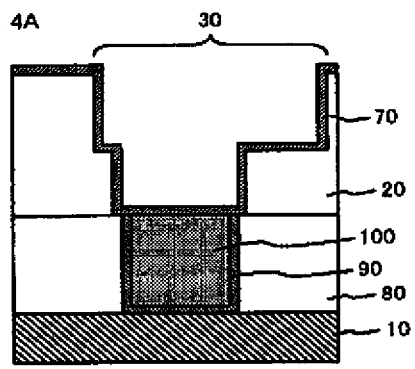
FIGS. 4A to 4D are sectional views showing process steps of manufacturing the semiconductor device according to the first embodiment.

First, as shown in FIG. 4A, the second dielectric multi-layered film 80 containing the lower interconnect 100, and the first dielectric multi-layered film 20 are sequentially stacked on the substrate (step 1), and the recess 30 is formed so as to extend through the first dielectric multi-layered film 20 (step 2). The dielectric film 70 containing substantially no oxygen is formed on the first dielectric multi-layered film 20 and inside the recess 30 (step 3).

Figure 4B:
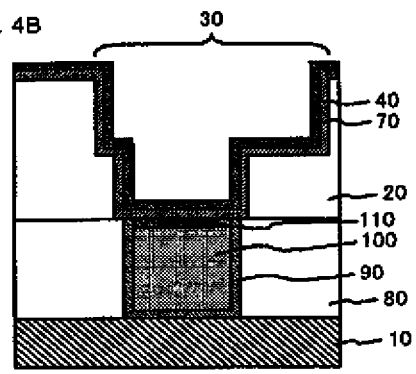

Then as shown in FIG. 4B, the MOx film 40 is formed on the dielectric film 70 extended over the inside and the outside of the recess 30 and at the bottom of the recess 30, by a sputtering process using $O_2$ as the oxidative atmosphere at a film-forming temperature of −50° C. or higher and 150° C. or lower (step 4). M is exemplified by Ru, which is used as a cathode target.

By adjusting the film-forming temperature to −50° C. or higher and 150° C. or lower, oxidation of the substrate may be suppressed. The adjustment is also contributive to avoid oxidation of the lower interconnect 100 during the film formation, and to solve the problems of degradation in the electrical characteristics and reliability of the semiconductor device.

Portions of the MOx film 40 and the dielectric film 70 formed at the bottom of the recess 30 are then removed by reverse sputtering using $H_2$ as a reductive atmosphere (step 5). By the removal, the lower interconnect 100 buried in the second dielectric multi-layered film exposes at the bottom of the recess 30. In addition, the surface of the lower interconnect 100 is reduced by adjusting the atmosphere to a reductive one.

By this process, an oxide layer 110 formed on the lower interconnect 100 exposed at the bottom of the recess 30 may be reduced in the reductive atmosphere. In addition, the oxygen concentration in the surficial portion of the lower interconnect maybe adjusted to 1% or smaller, and thereby the adhesiveness may be improved. As a consequence, resistivity of the interconnects may be reduced, and the reliability of the semiconductor device may be improved.

Figure 4C:
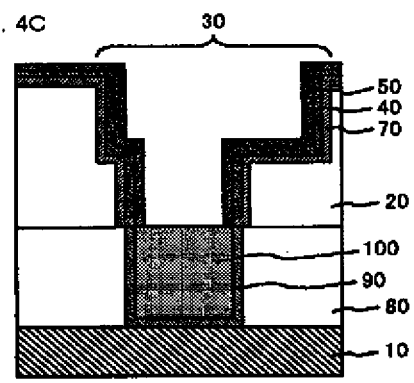

The M film 50 containing the M as a major component is then formed by sputtering, as shown in FIG. 4C, on the MOx film 40 extended over the inside and the outside of the recess 30 and at the bottom of the recess 30 (step 6), and a portion of the M film 50 formed at the bottom of the recess 30 is removed by reverse sputtering using $H_2$ as a reductive atmosphere, by adjusting the atmosphere to a reductive one (step 7). The M is exemplified by Ru.

By this process, the portion of the lower interconnect 100 exposed at the bottom of the recess 30 is reduced in the reductive atmosphere. In addition, the oxygen concentration in the surficial portion of the lower interconnect 100 may be suppressed to 1% or smaller, thereby the adhesiveness may be improved, resistivity of the interconnects may be reduced, and the reliability of the semiconductor device may be improved.

Figure 4D:
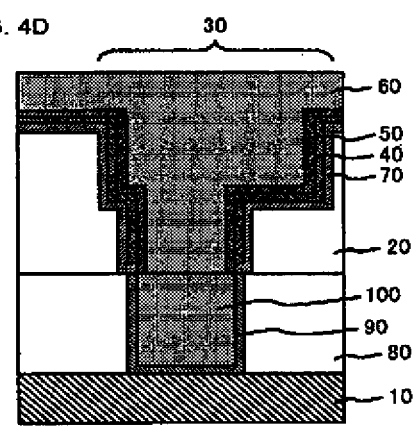

The electric conductor 60 containing Cu as a major component is then formed on the M film 50 extended over the inside and the outside of the recess 30, and so as to fill the recess as shown in FIG. 4D (step 8). Thereafter, portions of the MOx film 40, the M film 50, the dielectric film 70 and the electric conductor 60 laid outside of the recess 30 are removed.

By these process steps, a best mode of the present invention shown in FIG. 1 may be obtained.

They are mere examples of the present invention, wherein various configurations other than those described in the above may be adoptable, and similar effects may be obtainable.

For example, the step of reduction while adjusting the atmosphere to a reductive one may follow the step of reducing the MOx film 40, and may precede the step of forming the M film 50.

It is also allowable to successively carry out the processes from the step of removing a portion of the MOx film 40 to the step of forming the M film 50 at the bottom of the recess 30, while keeping the atmosphere in vacuo, by changing the sputtering atmosphere from the oxidative atmosphere to the reductive atmosphere, and by changing the bias voltage conditions from that for sputtering into that for reverse sputtering.

By further adjusting the bias voltage conditions, so as to allow removal based on the reverse sputtering to proceed at the bottom of the recess 30, and so as to allow deposition based on the sputtering to proceed on the sidewall of the recess 30 and outside the recess 30, formation of the MOx film 40 and removal of the portions of the MOx film 40 and the dielectric film 70 formed at the bottom of the recess 30 may be accomplished in a single process step. Similarly, it is also possible to carry out formation of the M film 50, and removal of the M film 50 at the bottom of the recess 30 in a single process step.

The oxidative atmosphere may not necessarily be pure $O_2$, wherein similar effects may be obtained if the atmosphere contains at least one gas selected from $O_2$, $O_3$, $H_2O$, organic substances containing —OH group(s), and $N_2O$.

The reductive atmosphere may not necessarily be pure $H_2$, wherein similar effects may be obtained if the atmosphere contains at least one gas selected from $H_2$, $NH_3$ and $SiH_4$.

The MOx film 40 and the M film 50 may be formed not only by sputtering, but also by chemical vapor deposition (CVD) process or atomic layer deposition (ALD) process.

Another embodiment will be explained below, while featuring aspects different from those in the first embodiment.

Second Embodiment

Figure 2:
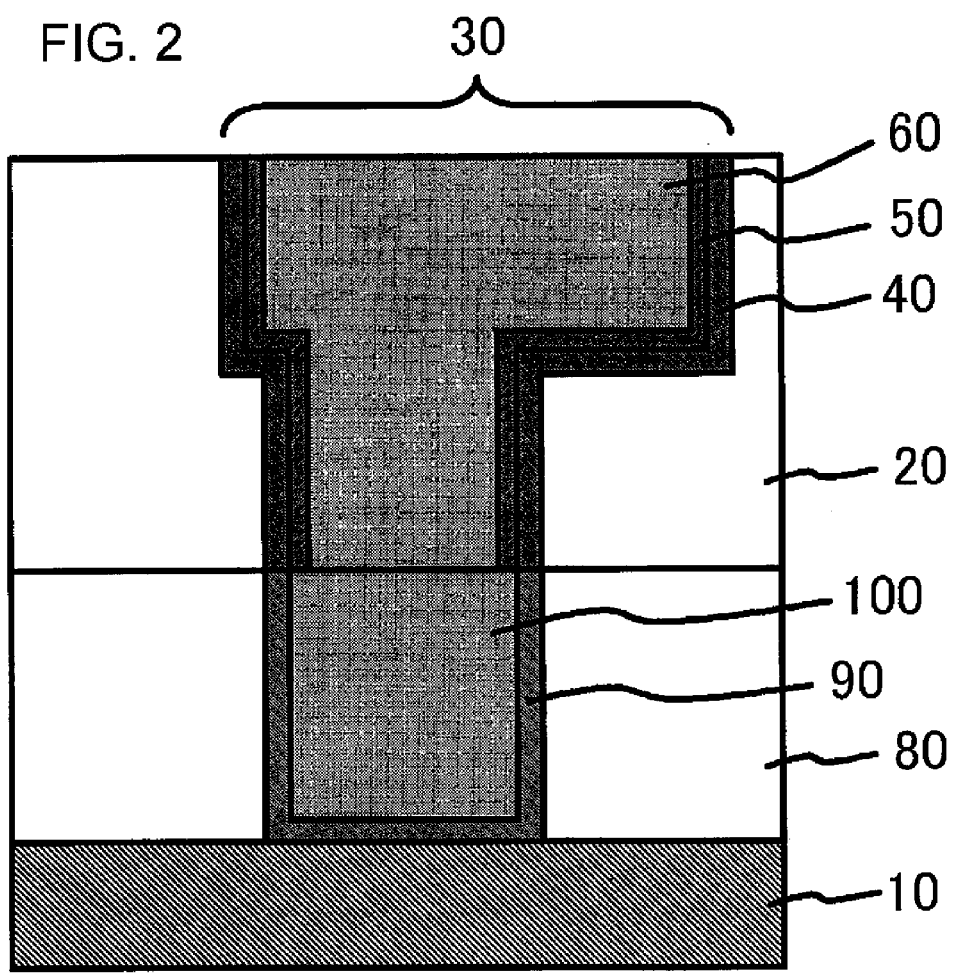
FIG. 2 is a sectional view showing a configuration of a semiconductor device according to a second embodiment.

FIG. 2 is a sectional view showing a part of the interconnect layer of the semiconductor device of this embodiment.

The semiconductor device has second dielectric multi-layered film 80 formed on the substrate and contains the lower interconnect 100, the first dielectric multi-layered film 20 formed on the second dielectric multi-layered film, and has the recess 30 formed therein, the MOx film 40 formed on the inner wall of the recess 30 and contains a metal M and oxygen as major components, the M film 50 formed on the MOx film 40 in the recess 30, and contains the M as a major component, and the electric conductor 60 containing Cu as a major component formed on the M film 50 so as to fill the recess 30.

Oxygen concentration of the surficial portion of the lower interconnect 100 fallen straight under the bottom of the recess 30 is 1% or smaller.

Unlike the first embodiment, the dielectric film 70 is not provided, and thereby the process steps of manufacturing may be simplified.

From the viewpoint of preventing degassing from p-MSQ, it is preferable to provide the dielectric film 70. However, for the case where the degassing from p-MSQ can be suppressed by any other techniques such as reducing the void ratio, oxidation of the M film 50 due to degassing proceeds only to a limited degree, and thereby the configuration shown in this embodiment may be obtained.

Effects similar to those obtained in the first embodiment are obtainable also in this embodiment.

Third Embodiment

Figure 3:
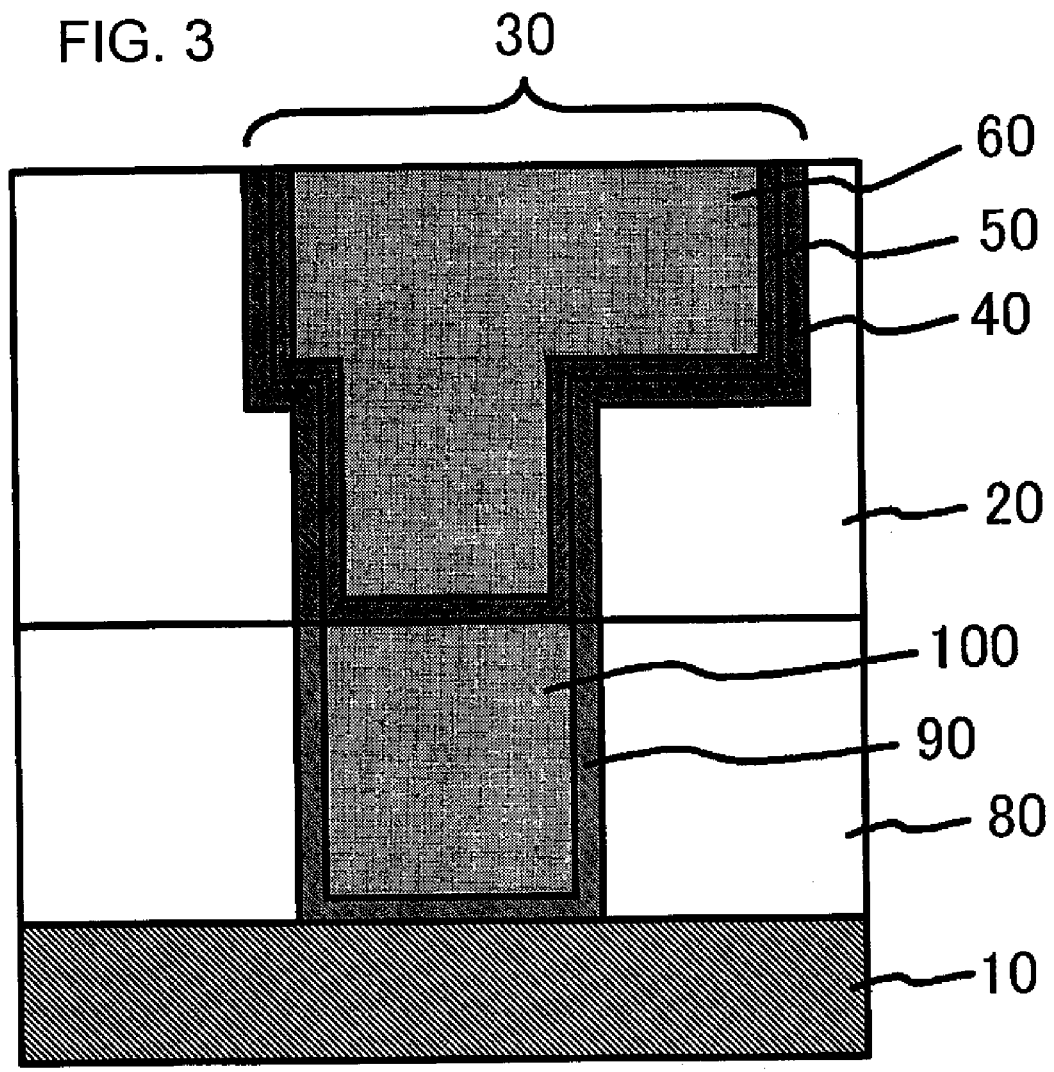
FIG. 3 is a sectional view showing a configuration of a semiconductor device according to a third embodiment.

FIG. 3 is a sectional view showing a part of the interconnect layer of the semiconductor device of this embodiment.

The semiconductor device has second dielectric multi-layered film 80 formed on the substrate and contains the lower interconnect 100, the first dielectric multi-layered film 20 formed on the second dielectric multi-layered film, and has the recess 30 formed therein, the MOx film 40 formed on the inner wall of the recess 30 and contains a metal M and oxygen as major components, the M film 50 formed on the MOx film 40 in the recess 30, and contains the M as a major component, and the electric conductor 60 containing Cu as a major component formed on the M film 50 in the recess 30 so as to fill the recess 30. The M film 50 herein is formed also at the bottom of the recess 30.

Oxygen concentration of the surficial portion of the lower interconnect 100 fallen straight under the bottom of the recess 30 is 1% or smaller.

Unlike the first embodiment, the M film 50 herein is provided also between the lower interconnect 100 which resides in the second dielectric multi-layered film 80 and the electric conductor 60. In other words, the M film 50 is formed at the bottom of the recess 30.

The configuration shown in this embodiment is excellent in view of integration or the like.

Next, a method of manufacturing the semiconductor device shown in FIG. 3 will be explained. FIGS. 5A to 5D are sectional views showing process steps of manufacturing the semiconductor device.

Procedures for manufacturing the semiconductor device typically include the process steps below:

step 1: forming the second dielectric multi-layered film 80 containing the lower interconnect 100 on the substrate, and forming the first dielectric multi-layered film 20 on the second dielectric multi-layered film 80;

step 2: forming the recess 30 in the first dielectric multi-layered film 20 so as to extend therethrough;

step 3: forming the MOx film 40 containing the metal M and oxygen as major components on the first dielectric multi-layered film 20 and inside the recess 30, in an oxidative atmosphere by a reactive film-forming process;

step 4: removing a portion of the MOx film 40 formed at the bottom of the recess 30;

step 5: forming the M film 50 containing the M as a major component on the MOx film 40 extended over the inside and the outside of the recess 30, and at the bottom of the recess 30;

step 6: forming the electric conductor 60 containing Cu as a major component on the M film 50 extended over the inside and the outside of the recess 30, so as to fill the recess 30; and step 7: removing portions of the MOx film 40, the M film 50 and the electric conductor 60 laid outside the recess 30.

The process steps will be detailed below.

Figure 5A:
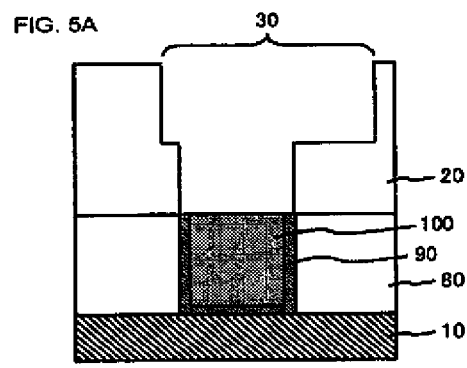
FIGS. 5A to 5D are sectional views showing process steps of manufacturing the semiconductor device according to the third embodiment.
Figure 5B:
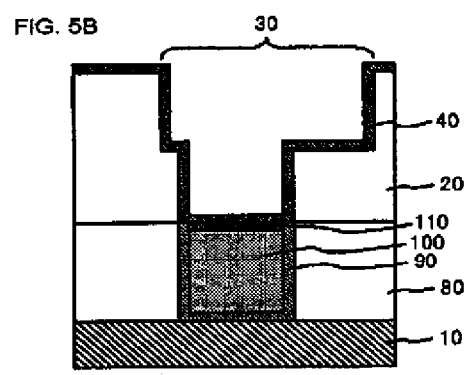

Steps 1, 2, 3 and 4 shown in FIGS. 5A and 5B are the same as those in the first embodiment, so that the explanation will not be repeated.

Figure 5C:
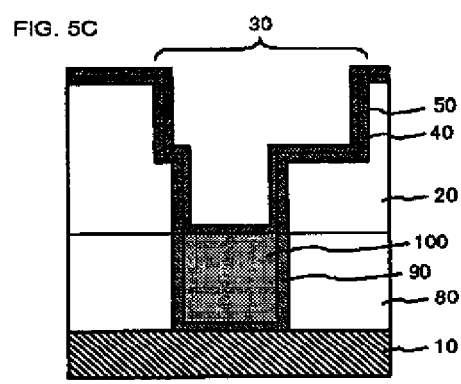

As shown in FIG. 5C, the M film 50 is formed on the MOx film 40 extended over the inside and the outside of the recess 30, and at the bottom of the recess 30 (step 5). M may typically be exemplified by Ta. The M film herein may be formed by the ALD process by alternatively supplying PDMAT (pentakis(dimethylamino)tantalum: $Ta[N(CH_3)_2]_5$) and plasma excited $He/H_2$ as the source gases. By this configuration, the oxide 110 formed on the lower interconnect 100 may be removed at the same time the M film 50 is formed. In addition, the oxygen concentration in the surficial portion of the lower interconnect may be adjusted to 1% or smaller, thereby the adhesiveness may be improved, and stability of the semiconductor device may be enhanced.

Figure 5D:
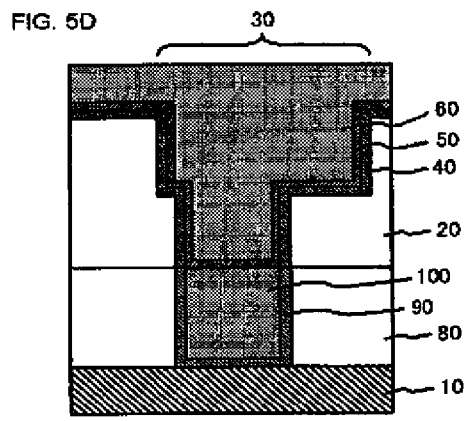

Then as shown in FIG. 5D, the electric conductor 60 containing Cu as a major component is formed on the M film 50 extended over the inside and the outside of the recess 30, and so as to fill the recess 30 (step 6). Thereafter, portions of the MOx film 40, the M film 50 and the electric conductor 60 laid outside the recess 30 are removed (step 7).

By these process steps, the embodiment shown in FIG. 3 may be obtained.

Effects similar to those obtained in the first embodiment are obtainable also in this embodiment.

The embodiments of the present invention have been described referring to the attached drawings, only as examples of the present invention, wherein various configurations other than those described in the above may also be adoptable.

It is apparent that the present invention is not limited to the above embodiment, that may be modified and changed without departing from the scope and spirit of the invention.

What is claimed is:

1. A method of manufacturing a semiconductor device, comprising:
    forming a second dielectric multi-layered film containing an interconnect on a substrate, and forming a first dielectric multi-layered film on said second dielectric multi-layered film;
    forming a recess in said first dielectric multi-layered film so as to extend therethrough;
    forming an MOx film, containing a metal M and oxygen as major components on said first dielectric multi-layered film and inside said recess, by a reactive film-forming process in an oxidative atmosphere;
    removing a portion of said MOx film formed at the bottom of said recess;
    forming an M film containing said M as a major component on said MOx film extended over the inside and the outside of said recess, and at the bottom of said recess;
    forming an electric conductor containing Cu as a major component on said M film extended over the inside and the outside of said recess, so as to fill said recess; and
    removing portions of said MOx film, said M film and said electric conductor laid outside of said recess.

2. The method of manufacturing a semiconductor device as claimed in claim 1, further comprising:
    forming, after said forming said recess, and before said forming said MOx film, a dielectric film containing substantially no oxygen on said first dielectric multi-layered film and inside said recess; and
    removing, after said forming said dielectric film, a portion of said dielectric film formed at the bottom of said recess.

3. The method of manufacturing a semiconductor device as claimed in claim 1, further comprising:
    removing a portion of said M film formed at the bottom of said recess.

4. The method of manufacturing a semiconductor device as claimed in claim 1,
    wherein said MOx film is formed at a film-forming temperature of −50° C. or higher and 150° C. or lower.

5. The method of manufacturing a semiconductor device as claimed in claim 1, further comprising:
    carrying out a reductive treatment of a portion of said interconnect fallen straight under the bottom of said recess, by adjusting the atmosphere to a reductive one.

6. The method of manufacturing a semiconductor device as claimed in claim 5,
    wherein said carrying out a reductive treatment by adjusting the atmosphere to a reductive one follows said reducing the MOx film, and precedes said forming the M film.

7. The method of manufacturing a semiconductor device as claimed in claim 5,
    wherein the reductive treatment is carried out by adjusting the atmosphere in said forming the M film to a reductive one.

8. The method of manufacturing a semiconductor device as claimed in claim 5,
    wherein said reductive atmosphere contains at least one gas selected from $H_2$, $SiH_4$ and $NH_3$.

9. The method of manufacturing a semiconductor device as claimed in claim 1,
wherein said oxidative atmosphere contains at least one gas selected from $O_2$, $O_3$, $H_2O$, organic substances containing —OH group(s), and $N_2O$.

10. The method of manufacturing a semiconductor device as claimed in claim 4,
wherein said removing a portion of said MOx film and said forming said M film are successively carried out while keeping the atmosphere in vacuo.

11. The method of manufacturing a semiconductor device as claimed in claim 1,
wherein said M is Ru.

* * * * *